United States Patent
Kato (10) Patent No.: US 7,368,340 B2
(45) Date of Patent: May 6, 2008

(54) SEMICONDUCTOR DEVICE AND METHOD OF MAKING SEMICONDUCTOR DEVICES

(75) Inventor: Juri Kato, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 156 days.

(21) Appl. No.: 11/367,656

(22) Filed: Mar. 2, 2006

(65) Prior Publication Data

US 2006/0202276 A1 Sep. 14, 2006

(30) Foreign Application Priority Data

Mar. 8, 2005 (JP) .............................. 2005-063580

(51) Int. Cl.
*H01L 21/8234* (2006.01)
(52) U.S. Cl. ...................... 438/197; 438/275
(58) Field of Classification Search ................ 438/197, 438/199, 219, 275, 279, 280, 404, 412, 421, 438/422; 257/500
See application file for complete search history.

(56) References Cited

U.S. PATENT DOCUMENTS 7,001,822 B2 * 2/2006 Iwamatsu et al. ........... 438/412
7,180,134 B2 * 2/2007 Yang et al. .................. 257/347

FOREIGN PATENT DOCUMENTS

| JP | 10-261799 | 9/1998 |
| JP | 2000-124092 | 4/2000 |
| JP | 2002-299591 | 10/2002 |

OTHER PUBLICATIONS

T. Sakai, et al., "Seperation By Bonding Si Islands (SBSI) for LSI Applications", Second International SiGE Technology and Device Meeting, Meeting Abstract, pp. 230-231, May (2004).

* cited by examiner

*Primary Examiner*—Tuan H. Nguyen
(74) *Attorney, Agent, or Firm*—John J. Penny, Jr.; Edwards Angell Palmer Dodge LLP (57) ABSTRACT

A semiconductor device includes a semiconductor substrate in which an insulating layer is formed in a part of an region, a semiconductor layer is formed by epitaxial growth and located on the insulating layer, a first gate electrode is formed at the sidewall of the semiconductor layer, first source and drain regions are formed in the semiconductor layer and located at the side of the first gate electrode, a second electrode is formed on the semiconductor substrate, and second source and drain regions are formed in the semiconductor substrate and located at the side of the second gate electrode.

4 Claims, 9 Drawing Sheets

SEMICONDUCTOR DEVICE AND METHOD OF MAKING SEMICONDUCTOR DEVICES

BACKGROUND OF THE INVENTION

Priority is claimed to Japanese Application No. 2005-063580 filed on Mar. 8, 2005, which is hereby incorporated by reference in its entirety.

1. Technical Field

The present invention relates to a semiconductor and a method of manufacturing a semiconductor, more particularly to a method for forming a SOI structure and bulk structure on the same substrate.

2. Related Field

The utility of a field effect transistor formed on a SOI substrate is well known because of the ease of isolating elements, avoiding latch up, and small source and drain contact capacitance. In theory, a perfect depletion SOI transistor is capable of fast driven operation with low power consumption and is easily driven by low voltage, enhancing active research for driving SOI transistors with the prefect depletion mode. Here, as a SOI substrate, a substrate of separation by implanted oxygen (SIMOX) and an attached substrate are used. JA2002-299591 and JA2000-124092 are examples of related arts.

Here, when a complementary metal oxide semiconductor (CMOS) is formed by using a SOI transistor, a P channel transistor is placed adjacent to an N channel transistor on the same second dimension plane and formed on the semiconductor having a {100} crystal face.

On the other hand, it is difficult to form a field effect transistor having a high current drive power and a high break down voltage on a SOI substrate of which thickness is constrained. Such a transistor is preferably formed on a bulk substrate. Further, JA 10-261799 discloses a method of forming a highly uniform and highly crystallized silicon thin film on a large area of an insulating film, wherein a polysilicon film has square shaped mono crystalline grains arranged in a matrix. The polysilicon film is formed on a insulating film by irradiating UV pulse beams to an amorphous or poly crystalline silicon film formed on a insulating film and the surface of the polycrystalline film is planarized with chemical and mechanical polishing (CMP.)

However, it is necessary to ion implant highly concentrated oxygen into a silicon wafer for forming a SIMOX substrate. Further, in order to manufacture an attached substrate, it is necessary to polish the surface of a silicon wafer after attaching two silicon wafers. Hence, there exists a problem of increasing manufacturing cost on a SOI transistor compared to a field effect transistor formed with a bulk semiconductor.

Further, there is the additional problem of difficulty in stabilizing characteristics of a field effect transistor when an SOI layer is thinned for manufacturing a perfect depletion SOI transistor because of large variation of the thickness of a SOI layer during ion implantation and polishing. Further, there is the additional problem of difficulty in high integration because of enlarging a necessary area for forming a CMOS circuit when a P channel field effect transistor and a N channel field effect transistor are placed on the same two dimensional plane. Further, there is the problem of enlarging wiring, which is necessary for connecting a P channel field effect transistor with a N channel field effect transistor, yielding transmission delay. When a CMOS circuit is formed on the semiconductor having the {100} crystal face, it is necessary that the channel width of a P channel field effect transistor is two or three times wider than that of a N channel field effect transistor due to the difference of mobility between electrons and holes. Thus, there is difficulty in high integration of elements since the layout balance between a P channel field effect transistor and a N channel field effect transistor is altered because of the above reason.

Further, in the silicon thin film formed on an insulating film by the method disclosed in JA 10-261799, micro defects such as grain boundary and micro twin exist. Hence, there is a problem of inferiority in characteristics of a transistor formed with a silicon thin film compared to a transistor made with a perfect crystalline silicon thin film. Further, when multi layered field effect transistors are deposited, a field effect transistor exists in the bottom. Hence, this structure deteriorates the planarization of a lower insulating film on which the upper silicon thin film is formed. Further, there is a problem of inferiority of crystallization in the upper silicon thin film comparing to the lower silicon thin film since thermal and other conditions for forming the upper silicon thin film are constrained.

Hence, in the conventional semiconductor device, a SOI structured device, which is made of defect free mono crystal, can not be installed on bulk silicon. Further, a device having three dimensional structure in which perfect crystalline silicon thin films having various thickness are deposited can not be realized.

SUMMARY

An advantage of an embodiment of the present invention is to provide a semiconductor device in which a SOI structure and a bulk structure are formed on the same substrate without using a SOI substrate and with a reduced layout area for SOI transistors, and a method of manufacturing the same.

According to one embodiment of the present invention, a semiconductor device includes: a semiconductor substrate in which an insulating layer is formed in a part of a region; a semiconductor layer formed by epitaxial growth and located on the insulating layer; a first gate electrode formed at a sidewall of the semiconductor layer; first source and drain regions formed in the semiconductor layer and located at a side of the first gate electrode; a second electrode formed on the semiconductor substrate; and second source and drain regions formed in the semiconductor substrate and located at a side of the second gate electrode.

In this aspect, a SOI structure can be formed on a part of the semiconductor substrate without using a SOI substrate and located at the sidewall of the semiconductor layer. Hence, it is possible to form a SOI structure and a bulk structure on the same semiconductor substrate while controlling manufacturing cost and improving integration of SOI transistors, constraining the increase of a chip size and realizing a system on a chip (SOC.)

Further, according to another aspect of an embodiment of the invention, the sidewall of the semiconductor layer having the first gate electrode is made of a {110} crystal face or {100} crystal face and the surface of the semiconductor substrate having the second gate electrode is also made of a {100} crystal face. Further according to another aspect of an embodiment of the invention, a semiconductor device includes: a semiconductor substrate in which an insulating layer is formed in a part of an region; first and second semiconductor layers are formed by epitaxial growth and deposited on the insulating layer; a P channel field effect transistor of which a channel region is located at the sidewall of the first semiconductor layer; a N channel field effect transistor of which a channel region is located at the sidewall of the second semiconductor layer; a N channel or P channel field effect transistor formed on the semiconductor substrate, of which a channel region is located on the surface of the semiconductor substrate.

Hence, it is possible to locate N channel and P channel field effect transistors with three dimensional structure and form a CMOS inverter, a NAND circuit and a NOR circuit, and install high voltage devices with them on the same chip. Accordingly, it is possible to form elements having various functions on the same chip while constraining the enlargement of a chip size and providing superior characteristics to transistors with controlling manufacturing cost.

Further according to another aspect of an embodiment of the invention, a semiconductor device includes: a gate electrode located at the sidewall of the first and second semiconductor layers, and commonly formed for the N channel and P channel field effect transistors; first source and drain regions formed in the first semiconductor layer and located at the both sides of the gate electrode; second source and drain regions formed in the second semiconductor layer and located at the both sides of the gate electrode.

Thus, it is possible to form a channel region on the sidewall of a semiconductor layer and constitute a field effect transistor without a gate electrode being placed on the surface of a semiconductor layer. Hence, when a field effect transistor is formed on a semiconductor layer, it is possible to maintain the planarization of the surface of the semiconductor layer and constrain the deterioration of crystal performance of the semiconductor layer when the N channel and P channel field effect transistors are formed. As the result, it is possible to operate the N channel and P channel field effect transistors with high speed and low voltage and highly integrate them.

Further according to another aspect of an embodiment of the invention, in the semiconductor device, the sidewalls of the first and second semiconductor layers are made of a {100} crystal face and the thickness of the first semiconductor layer is in the range from double to triple of the thickness of the second semiconductor layer. Thus, it is possible to widen the gate width of a P channel field effect transistor compared to the gate width of a N channel field effect transistor without enlarging a layout area of a P channel field effect transistor compared to that of a N channel field effect transistor. Thus, even when the mobility of a P channel field effect transistor is different from that of a N channel field effect transistor, it is possible to coincide current drive capability of a P channel field effect transistor with that of a N channel field effect transistor, as well as maintain a layout arrangement of a P channel field effect transistor and a N channel field effect transistor. As a result, it is possible to effectively design a layout of a CMOS circuit and ease the constraint of signal transmission speed, highly integrating a semiconductor device and attaining high speed operation of it.

Further according to another aspect of an embodiment of the invention, in a semiconductor device, the sidewalls of the first and second semiconductor layers are made of a {110} crystal face. Thus, it is possible to coincide the mobility between the P channel field effect transistor and the N channel field effect transistor without changing a layout area of the P channel field effect transistor and the N channel field. Further it is also possible to redress the current drive balance as well as the parasitic capacitance balance between the P channel field effect transistor and the N channel field effect transistor, improving a S/N ratio of a CMOS circuit and highly integrating a semiconductor device with high speed.

Further according to another aspect of an embodiment of the invention, in a semiconductor device, the semiconductor substrate is provided with a protection diode, bipolar transistor, an analog element or a high-voltage driven field-effect transistor, and the semiconductor layer is provided with a digital element or a low-voltage driven field-effect transistor. Thus, it is possible to attain low power consumption and high speed of a device formed on the semiconductor layer and install devices having various functions on the same chip with having excellent characteristics.

According to another aspect of an embodiment of the invention, a method of manufacturing a semiconductor device includes forming a first semiconductor layer by epitaxial growth on a part of the surface of the semiconductor substrate, forming a second semiconductor layer of which etching rate is smaller than that of the first semiconductor layer by epitaxial growth on a part of the surface of the first semiconductor layer, forming a supporting member for supporting the second semiconductor layer on the semiconductor substrate, the supporting member being made of a material of which the etching rate is smaller than that of the first semiconductor layer, forming an exposed portion in which a part of the first semiconductor layer is exposed, forming a hollow portion in which the semiconductor layer is removed, between the semiconductor substrate and the second semiconductor layer by selectively etching the first semiconductor layer via the exposed portion, forming an embedded insulating layer embedded in the hollow portion, exposing the sidewall of the second semiconductor layer, forming a first transistor of which a channel region is located at the sidewall of the second semiconductor layer, and forming a second transistor of which a channel region is located on the surface of the semiconductor substrate.

Thus, it is possible to remove the first semiconductor layer while leaving the second semiconductor layer and form the hollow portion under the second semiconductor layer and support the second semiconductor layer by the supporting member even when the hollow portion is formed under the second semiconductor layer. Further, by forming an exposed portion in which a part of the first semiconductor layer is exposed, it is possible to contact an etching gas or an etching liquid with the first semiconductor layer even when the second semiconductor layer is deposited on the first semiconductor layer and remove the first semiconductor layer while leaving the second semiconductor layer and form an insulating layer embedded in the hollow portion under the second semiconductor layer.

Thus, it is possible to place the second semiconductor layer on the insulating layer while reducing defects in the second semiconductor layer and attaining good insulation between the second semiconductor layer and the semiconductor substrate without losing the quality of the second semiconductor layer. Further, by forming the first transistor after exposing the sidewall of the second semiconductor layer, it is possible to place a channel region at the sidewall of the second semiconductor layer and form a SOI structure and a bulk structure on the same semiconductor substrate by forming the first semiconductor layer in a part of the surface of the semiconductor substrate. Accordingly, it is possible to form elements having various functions on the same chip while constraining the enlargement of chip size, yielding superior characteristic transistors, and controlling manufacturing cost even when a SOI structure and a bulk structure are formed on the same semiconductor substrate.

According to another embodiment of the invention, in a method of manufacturing a semiconductor device, the supporting member is an insulating layer for isolating elements. Thus, it is possible to support the second semiconductor layer on the semiconductor substrate by an insulating layer for isolating elements even when the hollow portion is formed under the second semiconductor layer. Hence, a process for forming a supporting member to support the second semiconductor layer is not necessary and a specific region for forming a supporting member is also not necessary. Accordingly, it is possible to form a SOI structure and a bulk structure on the same semiconductor substrate, reduce manufacturing process complexity and highly integrate a device formed on the same semiconductor substrate. Further, it is possible to form elements having various functions on the same chip while constraining chip size, yielding superior characteristic transistors, and controlling manufacturing cost even when a SOI structure and a bulk structure are formed on the same semiconductor substrate.

BRIEF DESCRIPTION OF THE DRAWINGS

The invention will be described with reference to the accompanying drawings, wherein like numbers refer to like elements, and wherein.

DESCRIPTION OF EMBODIMENTS

The present invention overcomes many of the problems associated with the prior art. The advantages, and other features of the systems and methods disclosed herein, will become more readily apparent to those having ordinary skill in the art from the following detailed description of certain preferred embodiments taken in conjunction with the drawings which set forth representative embodiments of the present invention and wherein like reference numerals identify similar structural elements. Unless otherwise specified, the illustrated embodiments can be understood as providing exemplary features of varying detail of certain embodiments, and therefore, unless otherwise specified, features, components, modules, elements, and/or aspects of the illustrations can be otherwise combined, interconnected, sequenced, separated, interchanged, positioned, and/or rearranged without materially departing from the disclosed systems or methods. Additionally, the shapes and sizes of components are also exemplary and unless otherwise specified, can be altered without materially affecting or limiting the disclosed technology. All relative descriptions herein such as top, bottom, left, right, up, down and the like are with reference to the Figures, and not meant in a limiting sense.

Figure 1:
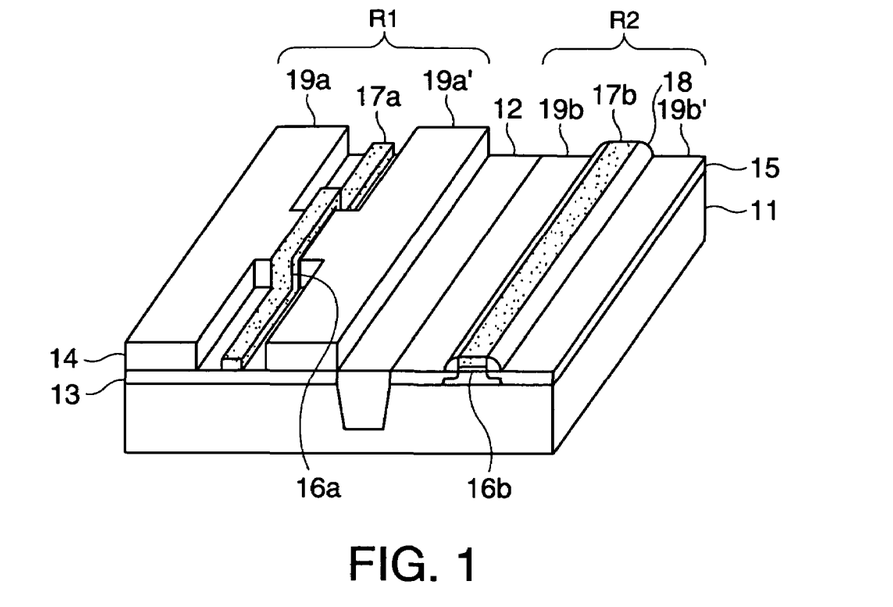
FIG. 1 is a perspective view showing a semiconductor device according to a first embodiment of the invention.

A semiconductor device and a method for manufacturing the semiconductor device according to an embodiment of the present invention will now be described with reference to the accompanying drawings. FIG. 1 is a perspective view showing a semiconductor device according to a first embodiment of the invention. In FIG. 1, a region R1 for forming a SOI structure and a region R2 for forming a bulk structure are formed on a semiconductor substrate 11. Then, in the semiconductor substrate 11, an insulating layer 12 for isolating elements is embedded for isolating the region R1 for forming a SOI structure from the region R2 for forming a bulk structure. Here, as a method of isolating the region R1 for forming a SOI structure from the region R2 for forming a bulk structure, the local oxidization of silicon (LOCOS) or the shallow trench isolation (STI) may be used among other processes now knows and later developed.

In the region R1 for forming a SOI structure, a semiconductor layer 14 is deposited over the semiconductor substrate 11 via an insulating layer 13 by epitaxial growth. Here, as materials of the semiconductor substrate 11 and the semiconductor layer 14, Si, Ge, SiGe, SiC, SiSn, PbS, GaAs, INP, GaP, GaN and ZnSe are used as examples. As the insulating layers 12a and 13, the insulating layer or the embedded insulating film such as SiO2, SiON and $Si_3N_4$ are used as examples. Further, if the semiconductor layer 14 is a semiconductor substrate formed on the insulating layer 13, a SOI substrate can be used. For example as a SOI substrate, a separation by implanted oxygen (SIMOX) substrate, an attached substrate and a laser annealed substrate can be used.

The semiconductor layer 14 is etched so that the sidewall is exposed on the insulating layer 13. When exposing the sidewall of the semiconductor layer 14, the semiconductor layer 14 is etched so as to have a constricted part. Further, when exposing the sidewall of the semiconductor layer 14, the configuration may be selected from the group consisting of a fin, a comb, a square, a grid and other desirable shapes. A gate electrode 17a is formed at the sidewall of the semiconductor layer 14 via a gate insulating film 16a. Here, the gate electrode 17a covers over the constricted part of the semiconductor layer 14 and is extended to both sidewalls of the semiconductor layer 14. In the semiconductor layer 14, source and drain regions 19a and 19a' are formed on the both sides of the gate electrode 17a.

On the other hand, the semiconductor layer 15 is formed on the semiconductor substrate 11 in the bulk region R2. The gate electrode 17b is formed on the semiconductor layer 15 via a gate insulating film 16b and a sidewall spacer 18 is formed at the sidewall of the gate electrode 17b. In the semiconductor layer 15, source and drain regions 19b and 19b' are formed on the both sides of the gate electrode 17b.

According to this structure, a SOI structure can be formed on a part of the semiconductor substrate 11 and a channel region is placed at the sidewall of the semiconductor layer 14. Hence, it is possible to form a SOI structure and a bulk structure on the same semiconductor substrate while controlling manufacturing costs, improving integration of SOI transistors, constraining the chip size and realizing a system on a chip (SOC.)

Here, the region R1 for forming a SOI structure may be provided with a digital element or a low-voltage driven field-effect transistor and the region R2 for forming a bulk structure may be provided with a protection diode, a bipolar transistor, an analog element or a high-voltage driven field-effect transistor. Thus, it is possible to attain low power consumption and high speed of a device formed on the region R1 for forming a SOI structure as well as high voltage durability and install devices having various functions on the same chip while having excellent performance characteristics.

Figure 2:
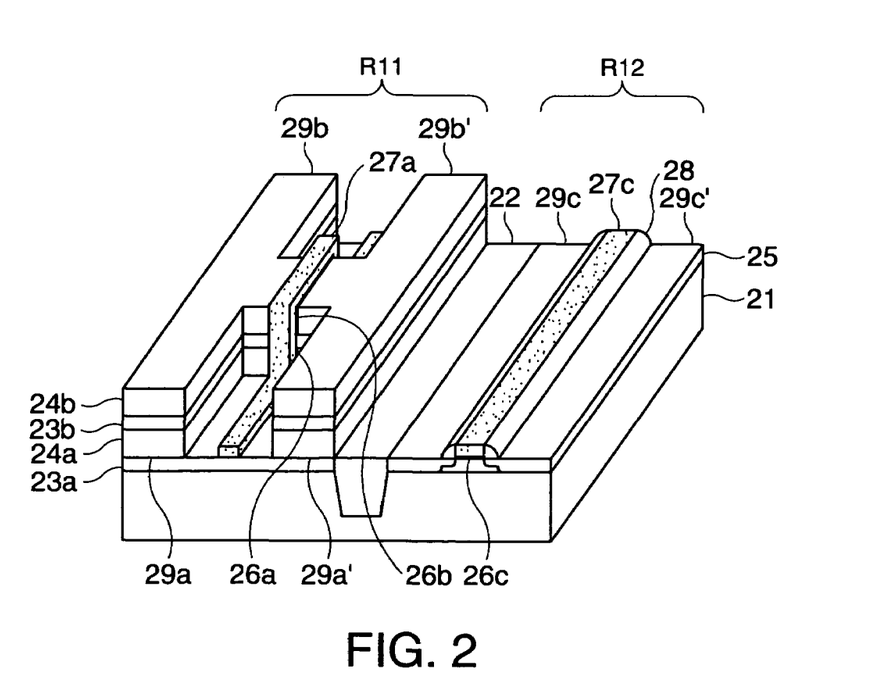
FIG. 2 is a perspective view showing a semiconductor device according to a second embodiment of the invention.

FIG. 2 is a perspective view showing a semiconductor device according to a second embodiment of the invention. In FIG. 2, a region R11 for forming a SOI structure and a region R12 for forming a bulk structure are formed on a semiconductor substrate 21. In the semiconductor substrate 21, an insulating layer 22 for isolating elements is embedded for isolating the region R11 for forming a SOI structure from the region R12 for forming a bulk structure.

In the region R11 for forming a SOI structure, a semiconductor layer 24a is deposited over the semiconductor substrate 21 via an insulating layer 23a by epitaxial growth. A semiconductor layer 24b is deposited over the semiconductor layer 24a via the insulating layer 23b by epitaxial growth. Then, the semiconductor layer 24a and the semiconductor layer 24b are etched so that the sidewall is exposed on the insulating layer 23a. When the sidewalls of the semiconductor layer 24a, the semiconductor layer 24b and the insulating layer 23b are exposed, each of the semiconductor layer 24a, the semiconductor layer 24b and the insulating layer 23b can be etched so as to have constricted parts of the semiconductor layer 24a, the semiconductor layer 24b and the insulating layer 23b. Further, when exposing the sidewalls of the semiconductor layer 24a, the semiconductor layer 24b and the insulating layer 23b, the configuration thereof may be like a fin, a comb, a square and a grid, for example. A gate electrode 27a is formed at the sidewall of the semiconductor layer 24a, 24b via the gate insulating films 26a and 26b. Here, the gate electrode 27a can cover over the constricted parts of the semiconductor layer 24a, the semiconductor layer 24b and the insulating layer 23b and can be extended to both sidewalls of the semiconductor layer 24a, the semiconductor layer 24b and the insulating layer 23b. In the semiconductor layer 24a, source and drain regions 29a and 29a' are formed on both sides of the gate electrode 27a. In the semiconductor layer 24b, source and drain regions 29b and 29b' are formed on both sides of the gate electrode 27a.

Still referring to FIG. 2, on the other side, a semiconductor layer 25 is formed on the semiconductor substrate 21 in the bulk region R12. A gate electrode 27c is formed on the semiconductor layer 25 via a gate insulating film 26c and a sidewall spacer 28 is formed at the sidewall of the gate electrode 27c. In the semiconductor layer 25, source and drain regions 29c and 29c' are formed on the both sides of the gate electrode 27c.

Thus, it is possible to form a channel region on the sidewalls of the semiconductor layers 24a and 24b and constitute field-effect transistors without the gate electrode 27a being placed on the surface of the semiconductor layers 24a and 24b. Hence, even when a field-effect transistor is formed in the semiconductor layers 24a and 24b, it is possible to maintain planarization of the surfaces of the semiconductor layers 24a and 24b. Even when the semiconductor layers 24a and 24b are deposited, it is possible to constrain the deterioration of crystalline of the semiconductor layers 24a and 24b. Hence, it is also possible to constrain the increase of the chip size and integrate field-effect transistors. Further, it is possible to reduce a parasitic capacitance of a field-effect transistor and attain steep sub-threshold characteristics, operating the transistor with high speed and low voltage.

Further, the gate electrode 27a is placed so as to be orthogonal to the multiple layer's surfaces of the semiconductor layers 24a and 24b. Then, it is possible to reduce the area for the gate electrode 27a in a chip and shorten the wiring length of the gate electrode 27a. Hence, it is possible to integrate field-effect transistors with constraining transmission delay. Further, the chip size can be reduced, attaining a field effect transistor with high speed, miniaturization and low cost.

Further, the gate electrode 27a is placed to cover over the surface of the semiconductor layer 24b. Hence, even when ions are implanted to the surface of the semiconductor layer 24b, it is possible to form source and drain regions 29a, 29a' and 29b, 29b' with the gate electrode 17a acting as a mask. Preferably, the source and drain regions 29a, 29a' and 29b, 29b' are formed toward the gate electrode 27a in a self-regulatory manner on the sidewalls of the semiconductor layers 24a and 24b. Accordingly, manufacturing processes are simplified and a field effect transistor with good performance can be manufactured thereby.

Here, the semiconductor layer 25 comprises a (100) mono crystalline semiconductor layer and the semiconductor layers 24a and 24b are formed so that the side of the {100} crystal face is exposed. Further, when a P channel field effect transistor is formed on the semiconductor layers 24a and the N channel field effect transistor is formed on the semiconductor layers 24b, for example, the thickness of the semiconductor layers 24a may be thicker than that of the semiconductor layers 24b. It is preferable that the ratio of the thickness of the semiconductor layers 24a to the thickness of the semiconductor layers 24b is the inverted ratio of the mobility of electrons to the mobility of holes. The thickness of the semiconductor layers 24a may be within the range of double or triple the thickness of the semiconductor layers 24b. Further, when a P channel field effect transistor is formed on the semiconductor layer 24a and the N channel field effect transistor is formed on the semiconductor layers 24b, for example, the thickness of the semiconductor layers 24a may be thicker than that of the semiconductor layers 24b. It is preferable that the ratio of the thickness of the semiconductor layers 24a to the thickness of the semiconductor layers 24b is the inverted ratio of the mobility of electrons to the mobility of holes. The thickness of the semiconductor layers 24a may be within the range of double or triple of the thickness of the semiconductor layers 24b.

Thus, it is possible to widen the gate width of a P channel field effect transistor compared to the gate width of a N channel field effect transistor without enlarging a layout area of a P channel field effect transistor compared to that of a N channel field effect transistor. Thus, even when the mobility of a P channel field effect transistor is different from that of a N channel field effect transistor, it is possible to coincide current drive capability of a P channel field effect transistor with that of a N channel field effect transistor, as well as maintain a layout arrangement of a P channel field effect transistor and a N channel field effect transistor. As a result, it is possible to effectively design a layout of a CMOS circuit and ease the constraint of signal transmission speed, while highly integrating a semiconductor device and attaining high speed operation thereof.

Still referring to FIG. 2, the semiconductor layer 25 comprises a (110) mono crystalline semiconductor layer the semiconductor layers 24a and 24b are formed so that the side of the {110} crystal face is exposed. Thus, even when a P channel field effect transistor and N channel field effect transistor are formed on the semiconductor layer 24a and 24b, it is possible to coincide current drive capability of a P channel field effect transistor with that of a N channel field effect transistor, without changing a layout arrangement of a P channel field effect transistor and a N channel field effect transistor. Thus, it is possible to redress the current drive balance as well as the parasitic capacitance balance between a P channel field effect transistor and a N channel field effect transistor, improving a SIN ratio of a CMOS circuit and highly integrating a semiconductor device with high speed.

Figure 3A:
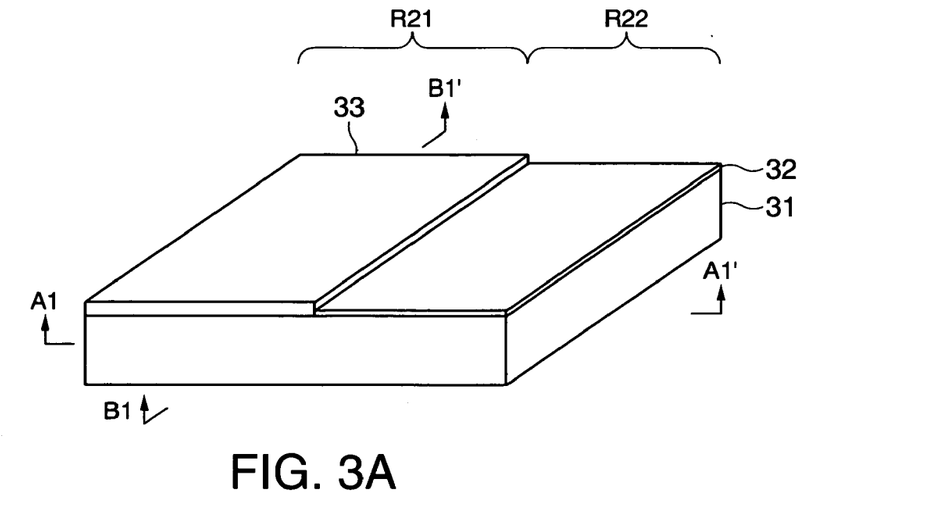
FIGS. 3A-C are diagrams showing a method of manufacturing a semiconductor device according to a third embodiment of the invention.
Figure 3B:
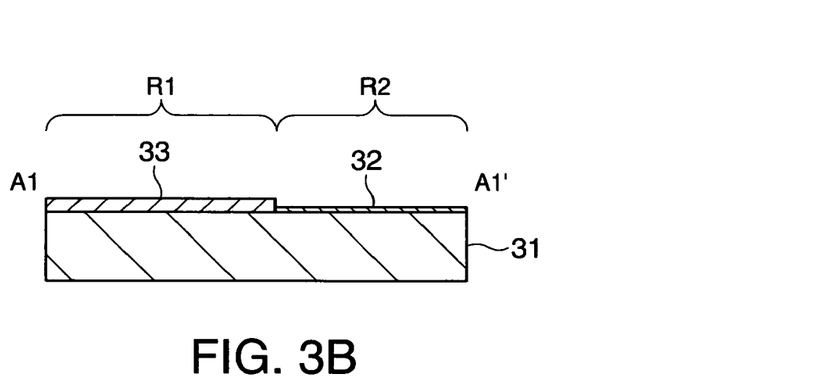
Figure 3C:
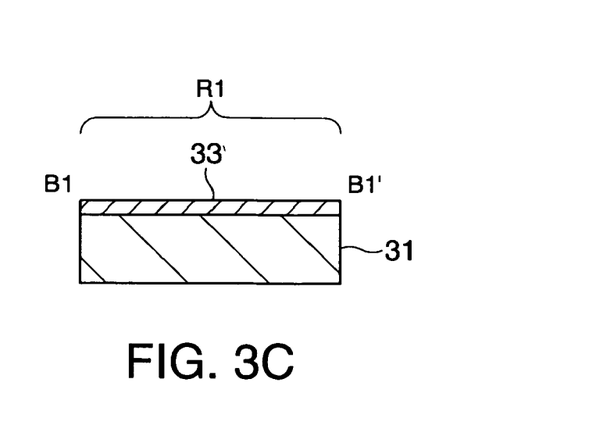

FIG. 3A to FIG. 10A are perspective views showing a process of manufacturing a semiconductor device of a third embodiment of the invention. FIG. 3B to FIG. 10B are cross sections along the line A1-A1' to A8-A8' of FIG. 3A to FIG. 10A, respectively. FIG. 3C to FIG. 10C are cross sections along the line B1-B1' to B8-B8' of FIG. 3A to FIG. 10A, respectively. Referring to FIGS. 3A-C, the region R21 for forming a SOI structure and the region R22 for forming a bulk structure are formed on the semiconductor substrate 31. An oxide layer 32 is formed on the surface of the semiconductor substrate 31 by thermally oxidizing the semiconductor substrate 31. As a material for the semiconductor substrate 31, Si, Ge, SiGe, SiC, SiSn, PbS, GaAs, InP, GaP, GaN and ZnSe are used, for example. The oxide layer 32 in the region R21 for forming a SOI structure is removed by patterning with photolithography and etching technology, exposing the surface of the semiconductor substrate 31. A first semiconductor layer 33 is selectively formed in the region R21 for forming a SOI structure on the semiconductor substrate 31 by selective epitaxial growth with the oxide layer 32 as a mask.

Figure 4A:
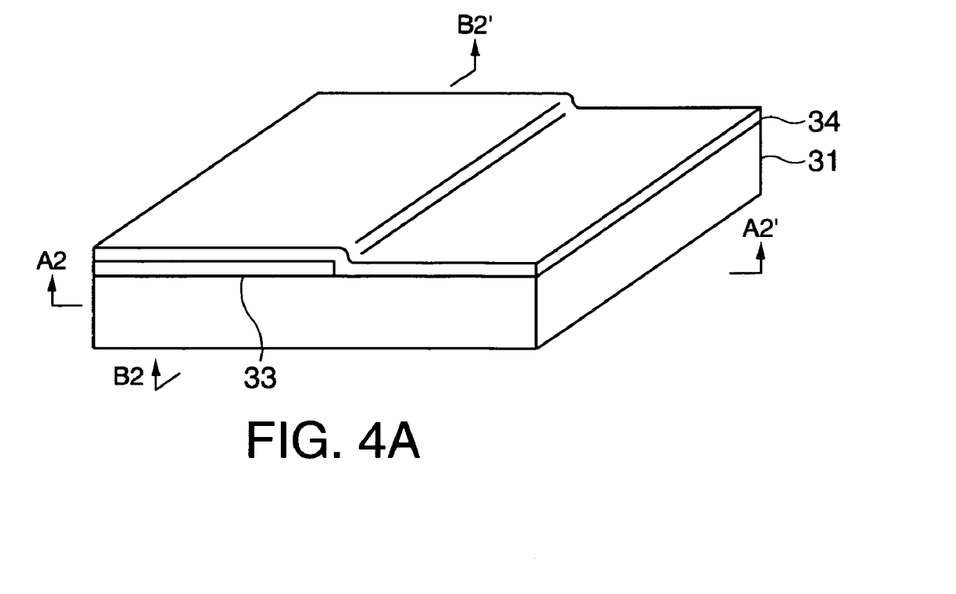
FIGS. 4A-C are diagrams showing a method of manufacturing a semiconductor device according to a third embodiment of the invention.
Figure 4B:
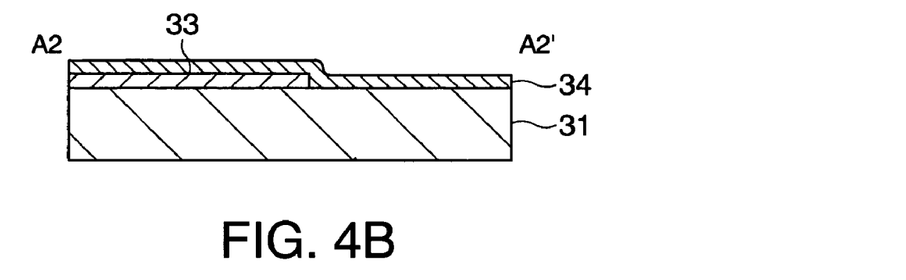
Figure 4C:
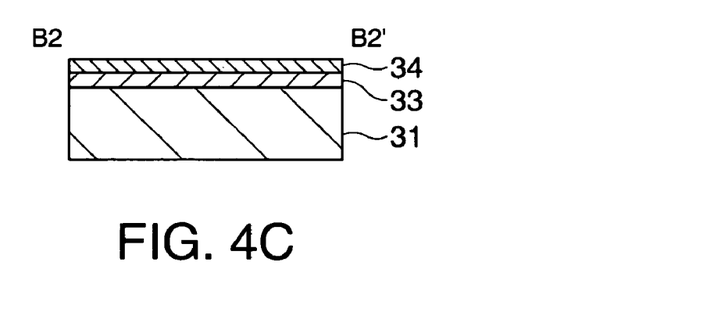

Then, the oxide layer 32 in the region R22 for forming a bulk structure is removed as shown in FIGS. 4A-C. Next, a second semiconductor layer 34 is formed in the region R21 for forming a SOI structure and the region R22 for forming a bulk structure on the semiconductor substrate 31 by epitaxial growth. Preferably, the material for the first semiconductor layer 33 has an etching rate which is larger than that of the second semiconductor layer 34 and the semiconductor substrate 31. As exemplary materials for the first semiconductor layer 33 and the second semiconductor layer 34, a combination selected from Si, Ge, SiGe, SiC, SiSn, PbS, GaAs, InP, GaP, GaN and ZnSe can be used. In particular, when the semiconductor substrate 31 is Si, it is preferable to use SiGe as the first semiconductor layer 33 and use Si as the second semiconductor layer 34. Thus, it is possible to perform lattice adjustment between the first semiconductor layer 33 and the second semiconductor layer 34 and maintain the selection ratio between the first semiconductor layer 33 and the second semiconductor layer 34 at etching. Here, a polycrystalline semiconductor layer, an amorphous semiconductor layer and a porous semiconductor may be used more than a mono crystalline semiconductor as the first semiconductor layer 33. A metal oxide layer such as γ-oxide aluminum may be used instead of the first semiconductor layer 33. This layer is formed by epitaxially growing a mono crystalline semiconductor Further, the thickness of the first semiconductor layer 33 and the second semiconductor layer 34 may be in the range of 10 to 200 nm.

Figure 5A:
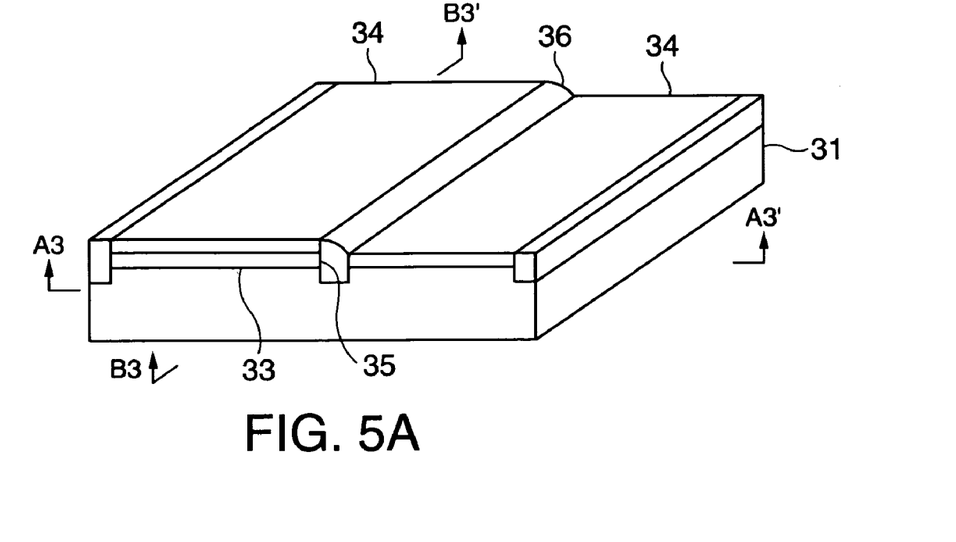
FIGS. 5A-C are diagrams showing a method of manufacturing a semiconductor device according to a third embodiment of the invention.
Figure 5B:
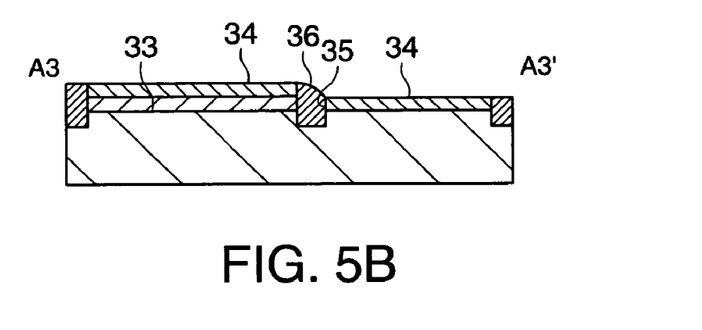
Figure 5C:
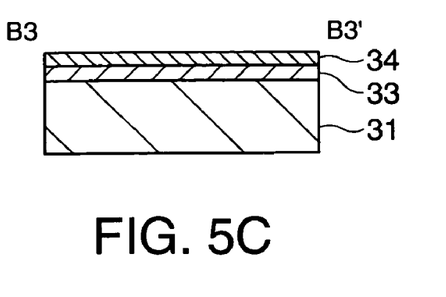

Next, as shown in FIGS. 5A-C, a groove 35 is formed at the boundary and the circumference between the region R21 for forming a SOI structure and the region R22 for forming a bulk structure. The depth of the groove is set to reach the semiconductor substrate 31 while penetrating the first semiconductor layer 33 and the second semiconductor layer 34. An insulating film 26 for isolating elements is embedded in the groove 35, isolating the region R21 for forming a SOI structure from the region R22 for forming a bulk structure and forming a supporting member for supporting the second semiconductor layer 34 on the semiconductor substrate 31.

Figure 6A:
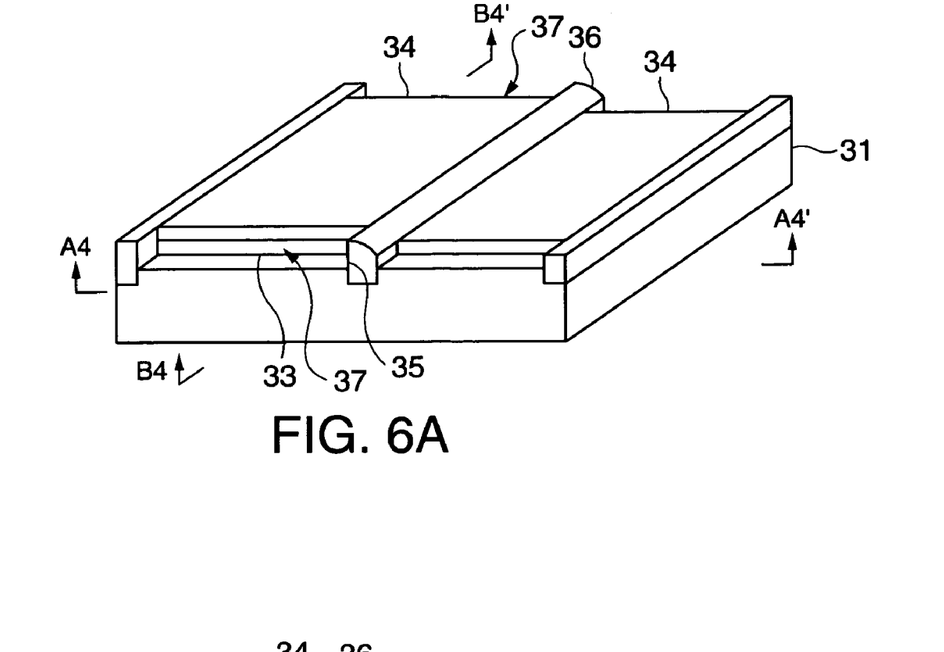
FIGS. 6A-C are diagrams showing a method of manufacturing a semiconductor device according to a third embodiment of the invention.
Figure 6B:
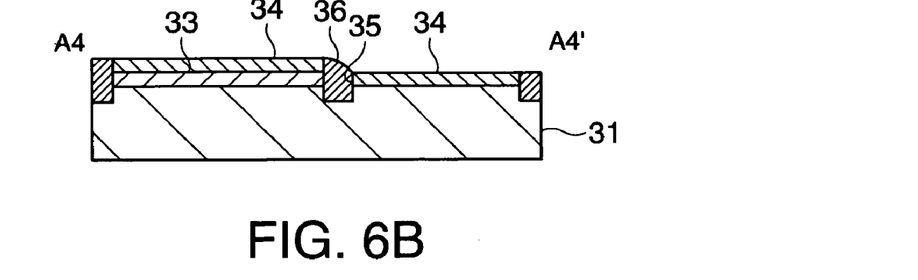
Figure 6C:
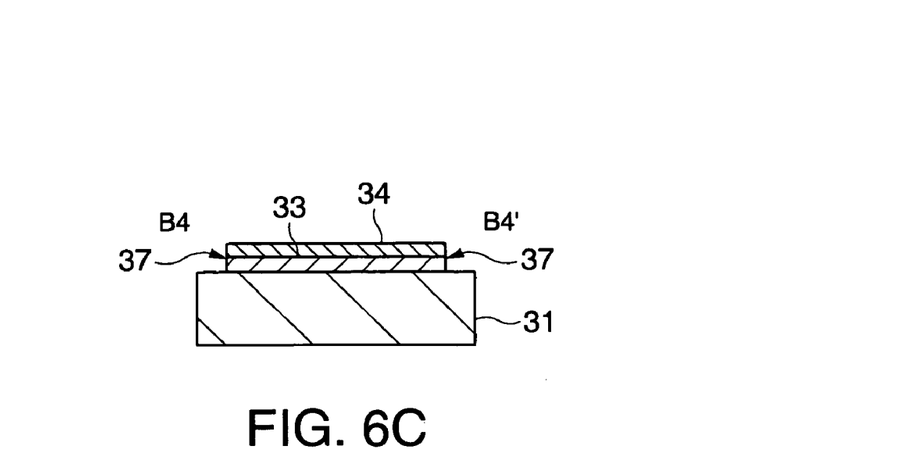

As shown in FIGS. 6A-C, the first semiconductor layer 33 and the second semiconductor layer 34 are patterned by photolithography and etching technology, forming an exposed surface 37, which is a part of the edges of the first semiconductor layer 33 and the second semiconductor layer 34. Here, when an exposed surface 37, which is a part of the edges of the first semiconductor layer 33, and the second semiconductor layer 34 are formed, etching may be stopped at the surface of the first semiconductor layer 33 or a concave portion may be formed in the first semiconductor layer 33 by over-etching the first semiconductor layer 33. Otherwise, the surface of the semiconductor substrate 31 may be exposed by penetrating the first semiconductor layer 33.

Figure 7A:
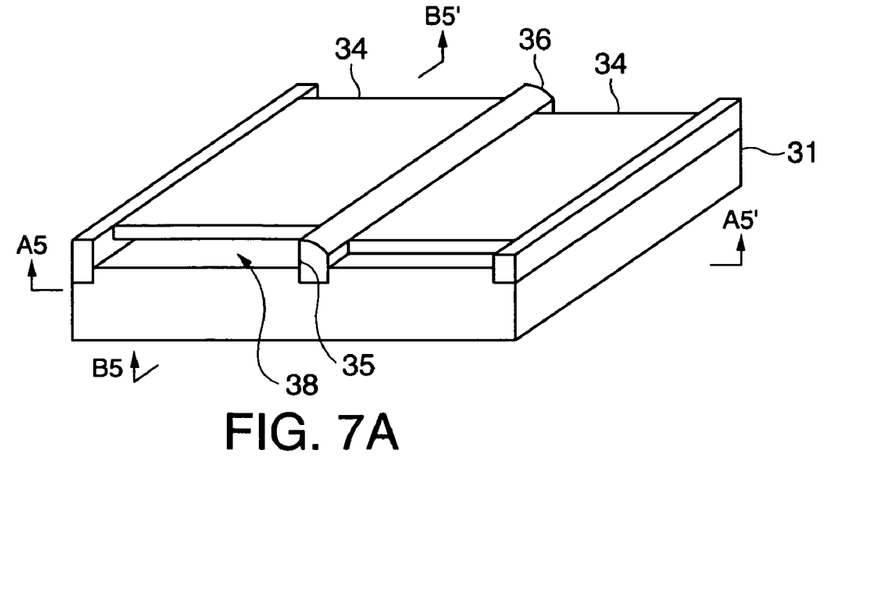
FIGS. 7A-C are diagrams showing a method of manufacturing a semiconductor device according to a third embodiment of the invention.
Figure 7B:
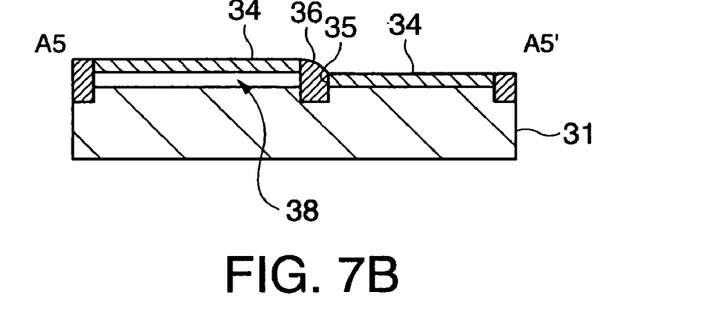
Figure 7C:
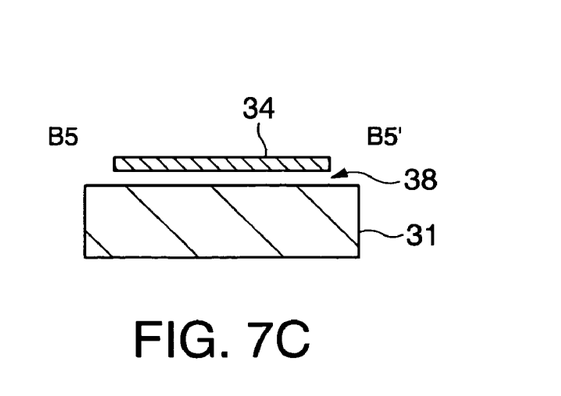

As shown in FIGS. 7A-C, the first semiconductor layer 33 is removed with etching by contacting an etching gas or an etching liquid to the first semiconductor layer 33 via the exposed surface 37. Thus, a hollow portion 38 is formed between the semiconductor substrate 31 and the second semiconductor layer 34 in the region R21 for forming a SOI structure thereby. Here, even when removing the first semiconductor layer 33, it is possible to avoid the second semiconductor layer 34 falling down to the semiconductor substrate 31 by supporting the second semiconductor layer 34 with the insulating film 36. Further, by forming the exposed surface 37, which is a part of the edges of the first semiconductor layer 33 and the second semiconductor layer 34, it is possible to contact an etching gas or an etching liquid to the first semiconductor layer 33 which is under the second first semiconductor layer 34, even when the second semiconductor layer 34 is deposited over the first semiconductor layer 33.

Thus, it is possible to avoid installing an additional supporting member for supporting the second semiconductor layer 34 and place the second semiconductor layer 34 on the insulating layer with reducing defects in the second semiconductor layer 34 and attain good insulation between the second semiconductor layer 34 and the semiconductor substrate 31 without losing the quality of the second semiconductor layer 34. Accordingly, it is possible to form elements having various functions on the same chip while constraining the enlargement of a chip size, yielding superior characteristic transistors, and control manufacturing cost even when a SOI structure and a bulk structure are formed on the same semiconductor substrate.

Here, it is preferable that a fluorinated and nitric acid (a mixture of HF, $HNO_3$, $H_2O$) is used as an etching liquid for the first semiconductor layer 33, when the semiconductor substrate 31 and the second semiconductor layer 34 are Si and the first semiconductor layer 33 is SiGe. Thus, it is possible to attain the selection ratio of Si to SiGe which is the range of 1:100 to 1:1000, constraining over-etching the semiconductor substrate 31 and the second semiconductor layer 34 with removing the first semiconductor layer 33. Here, hydrogen peroxide fluorinated nitric acid (HF, $HNO_3$, $H_2O_2$, $H_2O$), hydrogen peroxide ammonia ($NH_4$, $H_2O_2$, H$_2$O) or hydrogen peroxide fluorinated acetic acid (HF, CH$_3$COOH, H$_2$O$_2$, H$_2$O) may be used as an etching liquid for the first semiconductor layer 33.

Further, the first semiconductor layer 33 may be porous by anodic oxidation before removing it with etching. Otherwise, the first semiconductor layer 33 may be amorphous by implanting ions to the first semiconductor layer 33. Thus, the etching rate of the first semiconductor layer 33 can be increased thereby and the etched area of it can be enlarged.

Figure 8A:
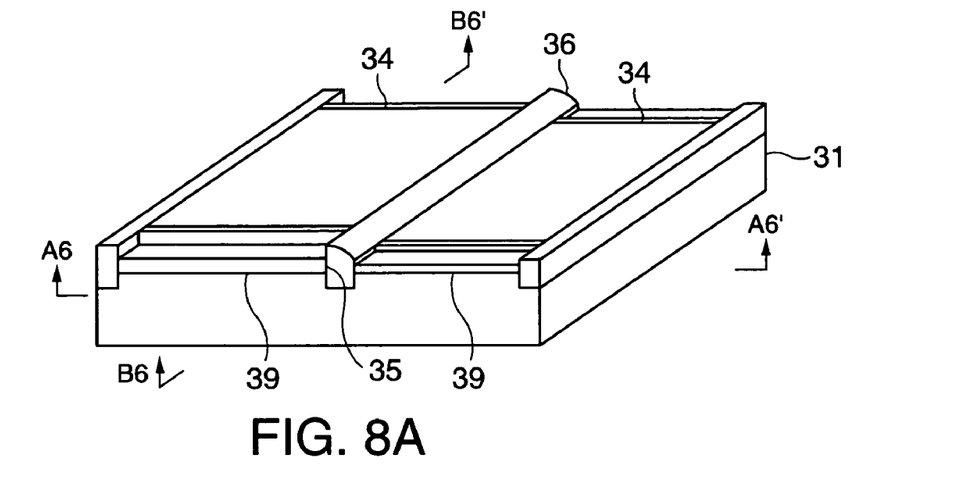
FIGS. 8A-C are diagrams showing a method of manufacturing a semiconductor device according to a third embodiment of the invention.
Figure 8B:
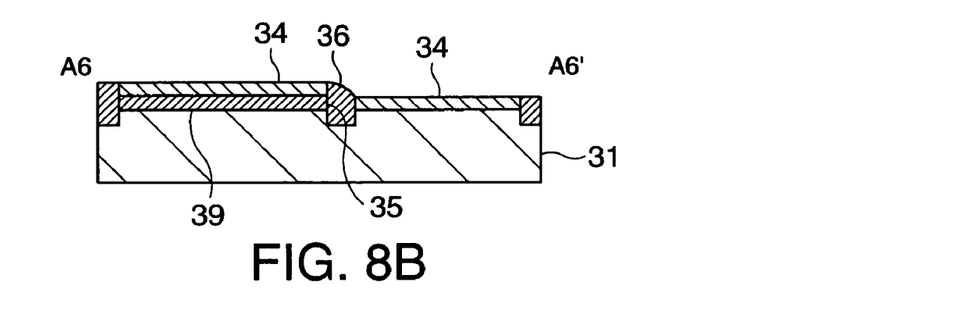
Figure 8C:
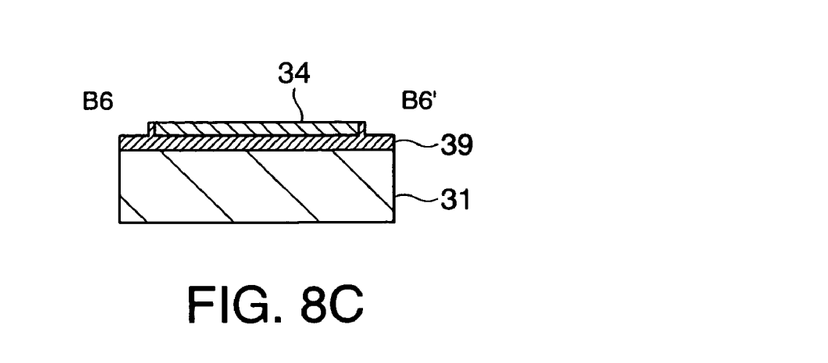

As shown in FIGS. 8A-C, an embedded insulating layer 39 is formed in the hollow portion 10 between the semiconductor substrate 31 and the second semiconductor layer 34 by thermally oxidizing the semiconductor substrate 31 and the second semiconductor layer 34. Thus, it is possible to regulate the thickness of the second semiconductor layer 34 after isolating elements by the thickness of the embedded insulating layer 39 at the time of thermally oxidizing the second semiconductor layer 34 and the thickness of the second semiconductor layer 34 at the time of epitaxial growth. Hence, it is possible to accurately control the thickness of the second semiconductor layer 34, reduce variation of thickness of the second semiconductor layer 34 and thin the second semiconductor layer 34.

High temperature annealing more than 1000° C. may be performed after forming the embedded insulating layer 39 in the hollow portion 38. Thus, it is possible to reflow the embedded insulating layer 39, relaxing the stress of the embedded insulating layer 39 and reducing the interface state at the boundary of the second semiconductor layer 34. Further, all of the hollow portion 38 may be filled with the embedded insulating layer 39 or a part of it may be filled.

Still referring to FIGS. 8A-C, the embedded insulating layer 39 is formed in the hollow portion 38 between the semiconductor substrate 31 and the second semiconductor layer 34 by thermally oxidizing the semiconductor substrate 31 and the second semiconductor layer 34. On the other side, the embedded insulating layer 39 is embedded in the hollow portion 38 between the semiconductor substrate 31 and the second semiconductor layer 34 by forming insulating film in the hollow portion 38 between the semiconductor substrate 31 and the second semiconductor layer 34 with a CVD method. Thus, it is possible to embed a material except an oxide film in the hollow portion 38 between the semiconductor substrate 31 and the second semiconductor layer 34 as well as preventing the thickness of the second semiconductor layer 34 from being reduced. Thus, it is possible to increase the thickness of the embedded insulating layer 39 placed on the back side of the second semiconductor layer 34 and reduce a dielectric constant. Further, the parasitic capacitance of the backside of the back side of the second semiconductor layer 34 can be reduced.

As a material of the embedded insulating layer 39, fluorinated silicate grass (FSG) film and a silicon nitride film can be used, for example, more than a silicon oxide film. Further, as a material for the embedded insulating layer 10, organic low k films such as a PSG film, BPSG film, a ploy aryleneether (PAE) film, a hydrogen silsesquiozane (HSQ) film, methyl silisesquioxane (MSQ) film, a PCB film, CF film SiOC film and SiOF film or like porous film may be used more than the spin on glass (SOG) film.

Figure 9A:
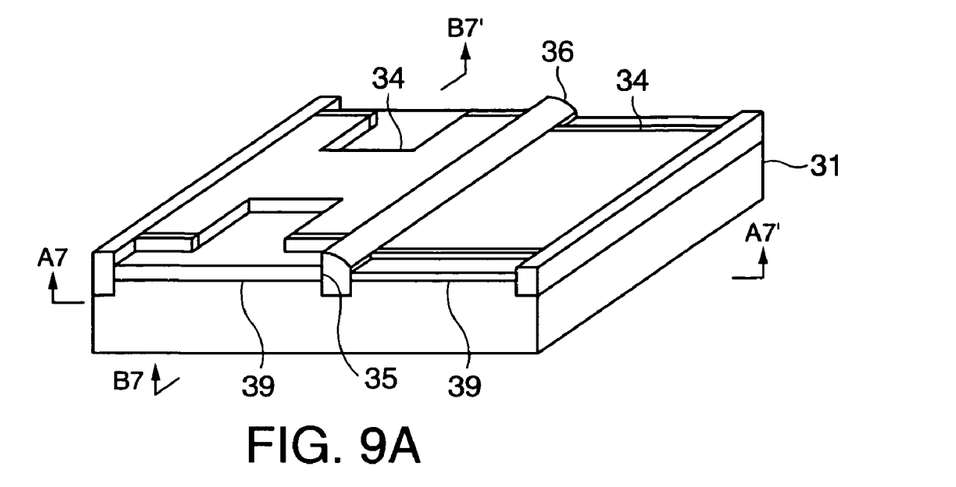
FIGS. 9A-C are diagrams showing a method of manufacturing a semiconductor device according to a third embodiment of the invention.
Figure 9B:
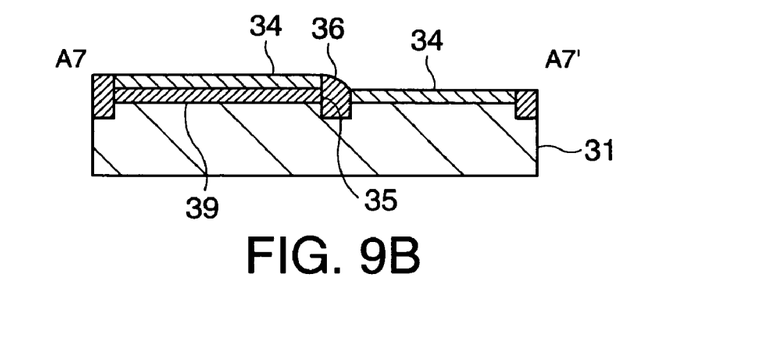
Figure 9C:
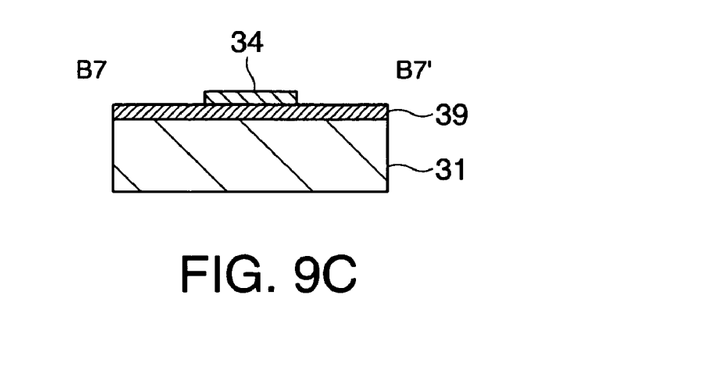

As shown in FIGS. 9A-C, the second semiconductor layer 34 and the embedded insulating layer 39 at the sidewall are patterned by photolithography and etching technology, exposing the sidewall of the second semiconductor layer 34. Here, when exposing the sidewall of the second semiconductor layer 34, the second semiconductor layer 34 may be patterned so as to have a constricted part, or configurations such as a fin, a comb, a square, a grid and like desired shapes.

Figure 10A:
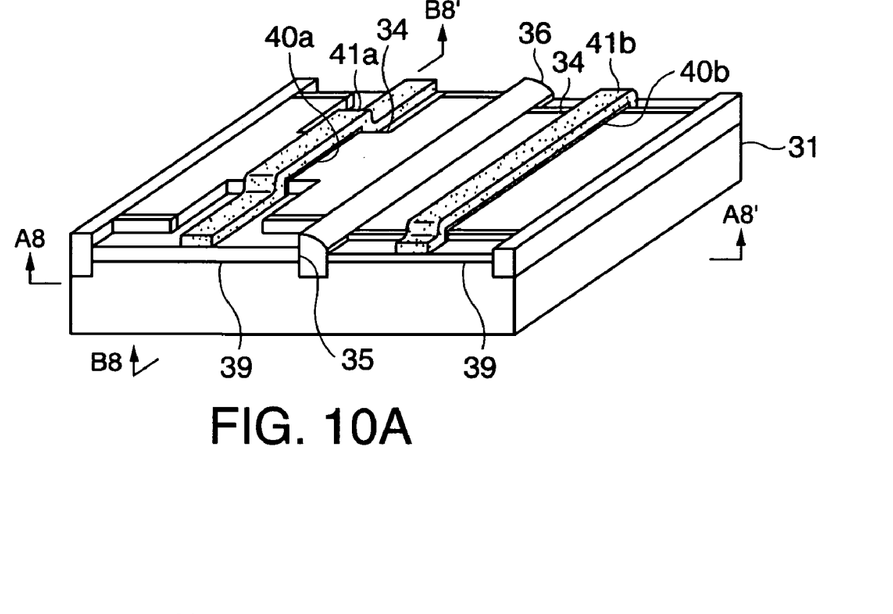
FIGS. 10A-C are diagrams showing a method of manufacturing a semiconductor device according to a third embodiment of the invention.
Figure 10B:
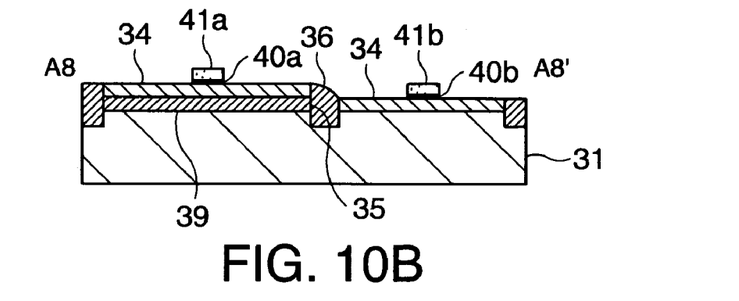
Figure 10C:
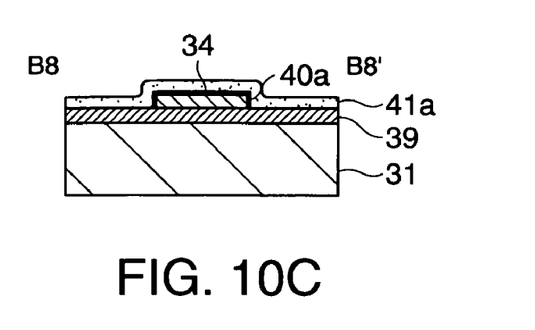

As shown in FIGS. 10A-C, a gate insulating film 40*a* is formed at the side of the second semiconductor layer 34 in the region R21 for forming a SOI structure by thermally oxidizing the surface and the side of the second semiconductor layer 34 in the region R21 for forming a SOI structure and the region R22 for forming a bulk structure. Also, a gate insulating film 40*b* is formed on the surface of the second semiconductor layer 34 in the region R22 for forming a bulk structure. Then, a poly silicon layer is formed on the second semiconductor layer 34 on which the gate insulating films 40*a* and 40*b* are formed. The poly silicon layer is patterned with photolithography and etching technology, forming a gate electrode 41*a* placed at the side of the second semiconductor layer 34 in the region R21 for forming a SOI structure. A gate electrode 41*b* is also formed on the surface of the second semiconductor layer 34 in the region R22 for forming a bulk structure thereby.

Impurity ions such as As, P and B are implanted into the second semiconductor layer 34 with the gate electrodes 41*a* and 41*b* as a mask, forming source and drain regions placed in the side of the gate electrodes 41*a* and 41*b* in the second semiconductor layer 34. Thus, a SOI structure can be formed on a part of the semiconductor substrate 31 and a channel region can be placed at the sidewall of the second semiconductor layer 34 without using a SOI substrate. Accordingly, it is possible to form a SOI structure and a bulk structure on the same semiconductor substrate 31 and form elements having various functions on the same chip while constraining the enlargement of chip size, yielding superior characteristics to the transistors and controlling manufacturing cost.

In the above embodiment, the method was disclosed wherein one single layer of the second semiconductor layer 34 is deposited on the semiconductor substrate 31 in the region 21 for forming a SOI structure via the embedded insulating layer 39. But, a plurality of semiconductor layers may be deposited on the on the semiconductor substrate 31 in the region 21 for forming a SOI structure.

While the invention has been described with respect to preferred embodiments, one skilled in the art will readily appreciate that various changes or modifications are possible without departing from the spirit/scope of the invention as defined by the appended claims.

What is claimed is:

1. A method of manufacturing a semiconductor device comprising:

forming a first semiconductor layer on a part of a surface of a semiconductor substrate;

forming a second semiconductor layer of which etching rate is smaller than that of the first semiconductor layer on a part of a surface of the first semiconductor layer;

forming a supporting member for supporting the second semiconductor layer on the semiconductor substrate, the supporting member being made of a material of which an etching rate is smaller than that of the first semiconductor layer;

exposing a portion of the first semiconductor layer;

removing the first semiconductor layer to form a hollow portion, the hollow portion being between the semiconductor substrate and the second semiconductor layer;

forming an embedded insulating layer embedded in the hollow portion;

exposing the sidewall of the second semiconductor layer;

forming a first transistor of which a channel region is located at the sidewall of the second semiconductor layer; and forming a second transistor of which a channel region is located on the surface of the semiconductor substrate.

2. The method of a semiconductor device according to claim 1, wherein the supporting member is a insulating layer for isolating elements.

3. The method of a semiconductor device according to claim 1, wherein the first and second semiconductor layers are formed by epitaxial growth.

4. The method of a semiconductor device according to claim 1, wherein the hollow portion is formed by selectively etching the first semiconductor layer via the exposed portion.

* * * * *